United States Patent
Wu et al.

(10) Patent No.: US 7,783,145 B2
(45) Date of Patent: Aug. 24, 2010

(54) ELECTRODE HAVING NANOFILAMENTS

(75) Inventors: Wei Wu, Mountain View, CA (US);
Zhaoning Yu, Mountain View, CA (US);
Shih-Yuan (SY) Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 340 days.

(21) Appl. No.: 11/872,180

(22) Filed: Oct. 15, 2007

(65) Prior Publication Data

US 2009/0162010 A1 Jun. 25, 2009

(51) Int. Cl.
*G02F 1/01* (2006.01)
(52) U.S. Cl. .............................................. 385/40; 385/2
(58) Field of Classification Search ........................ None
See application file for complete search history.

(56) References Cited

U.S. PATENT DOCUMENTS

| | | | |
|---|---|---|---|
| 5,461,246 A * | 10/1995 | Chou | .......................... 257/449 |
| 6,356,573 B1 | 3/2002 | Jonsson et al. | |
| 6,548,319 B2 | 4/2003 | Kwak | |
| 7,253,885 B2 | 8/2007 | Matsumoto | |
| 7,335,862 B2 * | 2/2008 | Takahashi | .................... 219/548 |
| 2002/0071172 A1 * | 6/2002 | Naiki | ......................... 359/305 |
| 2004/0256949 A1 * | 12/2004 | Hada et al. | .............. 310/313 B |
| 2005/0133476 A1 * | 6/2005 | Islam et al. | ..................... 216/2 |
| 2005/0227391 A1 * | 10/2005 | Jin et al. | ........................ 438/22 |
| 2006/0170846 A1 * | 8/2006 | Ozawa | ........................ 349/114 |
| 2007/0024179 A1 * | 2/2007 | Oyamada et al. | ............ 313/498 |

\* cited by examiner

*Primary Examiner*—Mike Stahl (57) ABSTRACT

An optical device includes optical layer and an electrode configured to reduce eddy currents. The electrode includes an electrically conductive base portion and a plurality of nanofilaments in connection with the electrically conductive base portion. The nanofilaments are configured to conduct an electric current between the optical layer and the base portion of the electrode.

20 Claims, 6 Drawing Sheets

FIG. 4

ELECTRODE HAVING NANOFILAMENTS

BACKGROUND

Optical devices, such as waveguides, lasers, light emitting diodes (LEDs), modulators, photodetectors, etc., often utilize electrodes to conduct a current through the optical device. For example, a laser may have two electrodes on either side of an active region to facilitate current flow through the active region of the laser to cause the laser to emit light. The active region of an optical device is a general term used to refer to an area through which a wavelength of light passes or areas where light and optical fields are generated or emitted. Active regions often include quantum wells and other gain mediums.

One drawback of conventional electrodes used in optical devices is that they are lossy. That is, conventional metallic electrodes allow eddy currents to be generated, which results in energy loss due to heat. To compensate for this loss, spacer layers, which are also known as cladding layers, are used in optical devices to physically move the electrodes away from active regions of optical devices. This minimizes the contact between electrodes and the optical field generated in the active regions of optical devices and, thus, helps reduce the formation of eddy currents.

However, adding spacer layers increases the costs and complexity of optical devices. Because the optical devices are more complex and require additional layers, they are more expensive, difficult, and time-consuming to manufacture. Moreover, the movement of the electrodes away from active regions where optical fields are generated reduces the efficiency of optical devices, because a current must flow through additional layers to be conducted by the electrodes.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to embodiments. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the description of the embodiments.

Embodiments of systems and methods for facilitating the flow of a current in an optical device while reducing eddy currents are disclosed herein. The systems and methods include an optical layer and an electrode associated with the optical layer. The electrode comprises an electrically conductive base portion and nanofilaments in connection with the base portion. The term "nanofilament," as used herein refers to nanostructures having one dimension that is substantially larger than another direction. For example, the nanofilaments may resemble nanowires, which have a width or diameter substantially smaller than the length of the nanowire. The nanofilaments used herein may have a width or diameter of less than about 100 nanometers (nm). For instance, in an embodiment, the nanofilaments may have a width less than about $\frac{1}{10}$ the wavelength of light in the optical device. The phrase "in connection with" means that the nanofilaments are electrically and physically connected to the base portion of the electrode. For instance, the nanofilaments may be formed by etching away portions of the electrode, as described in greater detail below. The nanofilaments may be positioned in contact with the optical layer to allow a current to flow between the optical layer and the base portion of the electrode through the nanofilaments.

The optical layer may comprise any layer used in an optical device. Optical devices include waveguides, lasers, light emitting diodes (LEDs), modulators, detectors, etc. Therefore, the optical layer may comprise semiconductor layers, cladding layers, active regions, etc., which are commonly used in optical devices. In one embodiment, the optical layer may comprise an active region, which refers to an area through which a wavelength of light passes or areas where light and optical fields are generated or emitted. Active regions often include quantum wells, gain mediums, and the like.

As set forth above, the electrode is associated with the optical layer, which means that the electrode is positioned to conduct a current between the optical layer and the electrode. The term "current," as used herein, refers to an electric current and may also include voltage. Thus, a part of the electrode, such as the nanofilaments, may be in direct physical contact with the optical layer. However, in other embodiments, the electrode may be separated from the optical layer by cladding layers, yet may still be operable to conduct a current between the electrode and the optical layer. In one embodiment, the electrode may be positioned such that only the nanofilaments of the electrode are in contact with the optical layer. Therefore, a current may pass between the optical layer and the base portion of the electrode via the nanofilaments.

The systems and method described herein have several benefits. For example, the electrodes described herein reduce eddy currents in optical devices by using the nanofilaments to conduct a current between the optical layer of the optical device and the base portion of the electrode. Reducing eddy currents entails inhibiting the formation of eddy currents and reducing the magnitude of formed eddy currents. The term "eddy current" also includes drifting currents, or fringing currents, which are generated when an electrical field is not vertical to a surface of a metal electrode. In some examples, eddy currents may be substantially eliminated. Reducing eddy currents increases efficiency and reduces loss. Moreover, the electrodes described herein may be moved closer or provided in direct contact with optical layers, thereby eliminating the need for additional spacer layers between electrodes and optical layers. Thus, the systems and methods described herein result in faster optical devices.

Figure 1A:
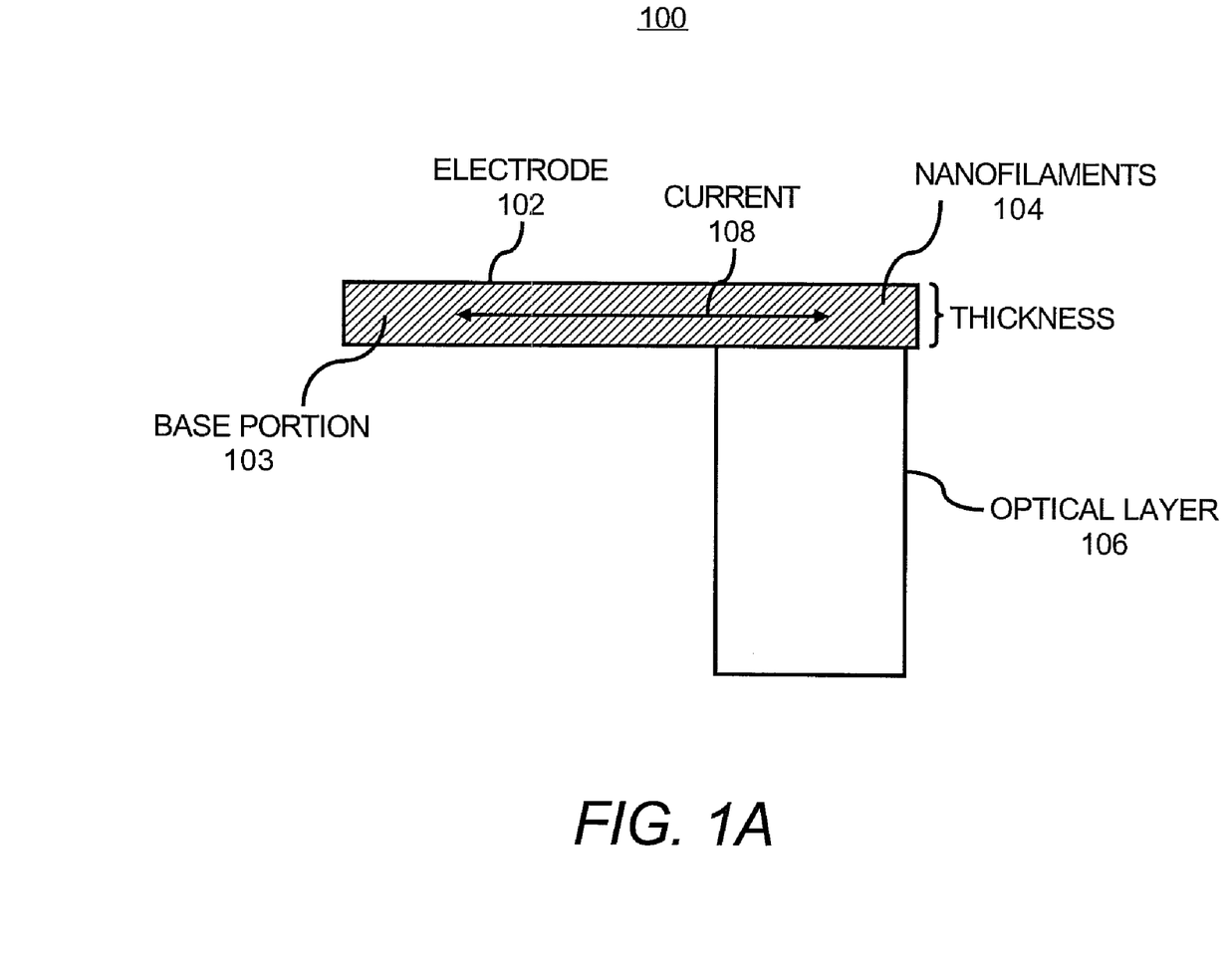
FIG. 1A illustrates a cross-sectional side view of an optical device, according to an embodiment.

With respect to FIG. 1A, there is shown a cross-sectional side view of an optical device 100, according to an embodiment. It should be understood that the following description of the optical device 100 is but one manner of a variety of different manners in which such an optical device 100 may be configured. In addition, it should be understood that the optical device 100 may include additional elements, layers, and devices not shown in FIG. 1A and that some of the features described herein may be removed and/or modified without departing from a scope of the optical device 100.

The optical device 100 may be any reasonably suitable device for emitting, generating, guiding, detecting, etc. a wavelength of light. Suitable optical devices include, for example, waveguides, lasers, LEDs, modulators, detectors, and the like. The optical device 100, illustrated in FIG. 1A, includes an electrode 102 and an optical layer 106. The optical layer 106 may be any reasonably suitable material used in an optical device. For example, the optical layer 106 may comprise a semiconductor layer, a cladding layer, an active region, quantum wells, doped layers, etc. Although FIG. 1A depicts the optical layer 106 as a single layer, a person having ordinary skill in the art will appreciate that the optical layer 106 may include two or more layers. For instance, the optical layer 106 may comprise a combination of cladding layers, gain medium layers, quantum wells, etc. Moreover, a person having ordinary skill in the art will appreciate that the optical device 100, shown in FIG. 1A, is only a general representation and that the optical device 100 may include additional layers and features, which are commonly found in optical devices, such as semiconductor layers, quantum wells, other electrodes, devices for inducing current flow, etc.

Figure 1B:
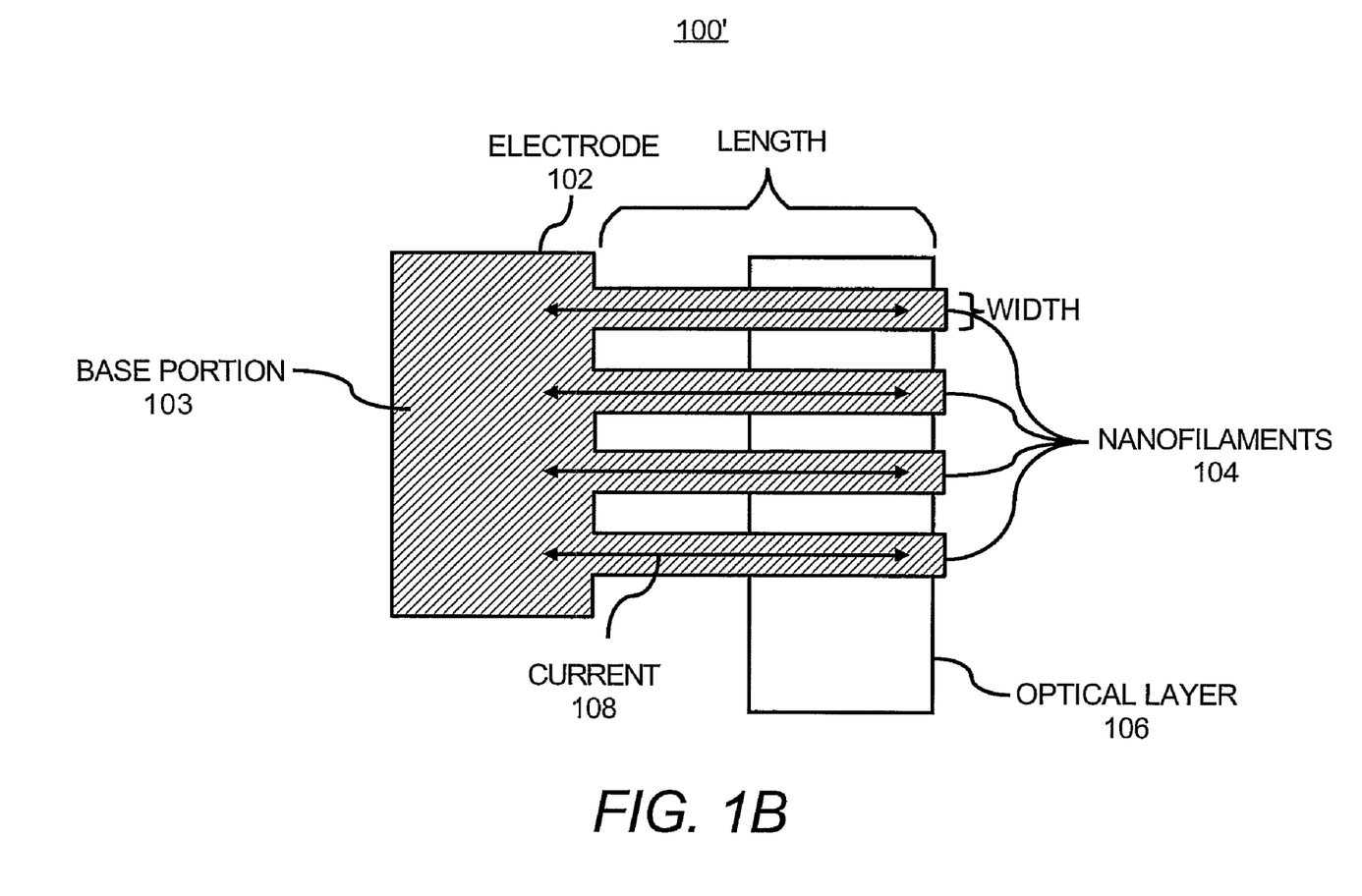
FIG. 1B illustrates a top view of an optical device, according to an embodiment.

The electrode 102 comprises a base portion 103 in connection with nanofilaments 104, which are described in greater detail below with respect to FIG. 1B. The electrode 102 is configured to conduct a current 108 through the optical layer 106. The current 108 is depicted as a double-headed arrow because the current 108 may flow in both directions between the base portion 103 and the nanofilaments 104. In FIG. 1B, there is shown a top view 100' of the optical system 100, shown in FIG. 1A, according to an embodiment. According to this embodiment, the nanofilaments 104 extend from the base portion 103 and are positioned substantially perpendicular to the optical layer 106. As illustrated in FIGS. 1A and 1B, the nanofilaments 104 have a width, length, and thickness. The width of the nanofilaments 104 may be less than about 100 nm. In some examples, the nanofilaments 104 may have a width of about 2-20 nm or less than about $\frac{1}{10}$ the wavelength of light in the optical layer 106. The nanofilaments 104 may generally range in thickness from about 10 to about 300 nm and may have any reasonably suitable length.

As mentioned above, the nanofilaments 104 may be designed to reduce eddy currents. That is, the configuration and arrangement of the nanofilaments 104 may reduce the conductivity of the nanofilaments 104 in the direction of their thickness and width, while retaining conductivity along their length. This is due, in part, to the relatively small width of the nanofilaments 104 and the spacing between the nanofilaments 104, which acts as insulation gaps. Electrons cannot cross these insulation gaps between the nanofilaments 104 and, thus, the formation of eddy currents is inhibited. In some embodiments, the nanofilaments 104 may act as insulators across their thickness or width, while functioning as conductors along their length. In this manner, the nanofilaments 104 may facilitate current flow between the base portion 103 of the electrode 102 and the optical layer 106, while reducing eddy currents.

The electrode 102 may be formed from any reasonably suitable conductive materials, including metals and metallic compounds. The nanofilaments 104 may be formed by etching the electrode 102 through processes such as nanoimprinting, nanolithography, and the like. The nanofilaments 104 may also be formed by growing the nanofilaments 104 on the base portion 103 of the electrode 102 using known processes of growing nanowires. Although the nanofilaments 104 are depicted in FIGS. 1A and 1B as being substantially rectangular, the nanofilaments 104 may also have curved or circular dimensions. Moreover, while four nanofilaments 104 are shown in FIG. 1B, a person having ordinary skill in the art will appreciate that the electrode 102 may have any reasonably suitable number of nanofilaments 104. In addition, it should be understood that although the nanofilaments 104 shown in FIG. 1B have substantially equivalent sizes, each of the nanofilaments 104 may have different lengths, widths, and diameters.

Figure 1C:
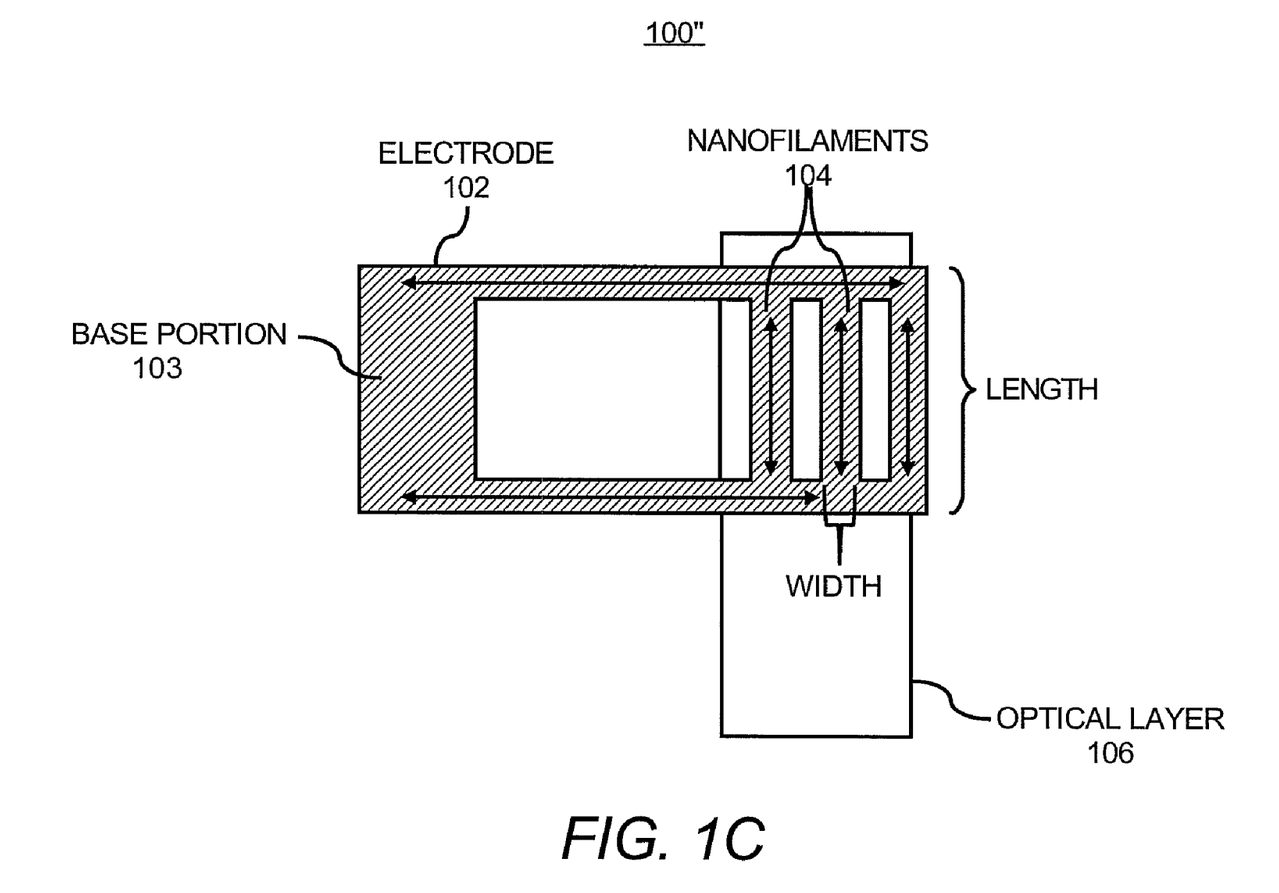
FIG. 1C illustrates a top view of an optical device, according to another embodiment.

With respect to FIG. 1C, there is shown a top view 100" of the optical device 100, shown in FIG. 1A, according to another embodiment. According to the embodiment shown in FIG. 1C, the nanofilaments 104 of the electrode 102 are positioned substantially parallel to the optical layer 106. Thus, in both FIGS. 1B and 1C, the electrode 102 is positioned such that only the nanofilaments 104 are in contact with the optical layer 106. This arrangement reduces the surface area of the electrode 102 that is in contact with the optical layer 106, thereby reducing eddy currents, while still conducting a current between the electrode 102 and the nanofilaments 104. The arrangement of the nanofilaments 104, depicted in FIG. 1C, also minimizes loss due to drifting currents, because the nanofilaments 104 are substantially vertical to the electrical field. Thus, the embodiment depicted in FIG. 1C may be used when light is polarized in the "paper plane." That is, the electrode 102 may be designed vertical to the polarization of the light in the optical layer 106 to further reduce loss. The length and width of the nanofilaments shown in FIG. 1C may be substantially similar to the length and width of the nanofilaments 104 described above with respect to FIG. 1B.

Although the nanofilaments 104 are shown as being substantially perpendicular and parallel to the optical layer 106 in FIGS. 1B and 1C, respectively, a person having ordinary skill in the art will appreciate that the nanofilaments 104 may be arranged with any reasonably suitable angular configuration to the optical layer 106 so long as the nanofilaments 104 retain the ability to conduct a current between the base portion 103 of the electrode 102 and the optical layer 106. Similarly, as described above with respect to FIG. 1B, the electrode 102 may have any reasonably suitable number of nanofilaments 104, which may be different sizes or substantially uniform in size. Moreover, the nanofilaments 104 do not have to be substantially parallel to each other, as shown in FIGS. 1B and 1C. That is, the nanofilaments 104 may be angled in different directions with respect to each other.

In FIGS. 1B and 1C, the nanofilaments 104 are depicted as being arranged in a substantially uniform configuration. That is, the nanofilaments 104 have substantially the same distance between them. This distance between the nanofilaments 104 is referred to hereinafter as "period" and the nanofilaments 104 may have many different variations in period. In one example, the period of the nanofilaments 104 may range from about 20 nm to about 200 nm. Moreover, the period of the nanofilaments 104 may be substantially non-uniform. That is, the distance between each of the nanofilaments 104 may vary. In one embodiment, the nanofilaments 104 may be clustered together in groups, such that two or more nanofilaments 104 are relatively close together, while other nanofilaments 104 are spaced farther away from the cluster of nanofilaments 104. For instance, the nanofilaments 104 may be grouped at the field minimum. In one embodiment, the period (p) of the nanofilaments 104 may be determined by the number of modes in the optical layer 104, which may be determined by the following equation:

$p=\lambda/(2n)$, where n is the refractive index.

Figure 2:
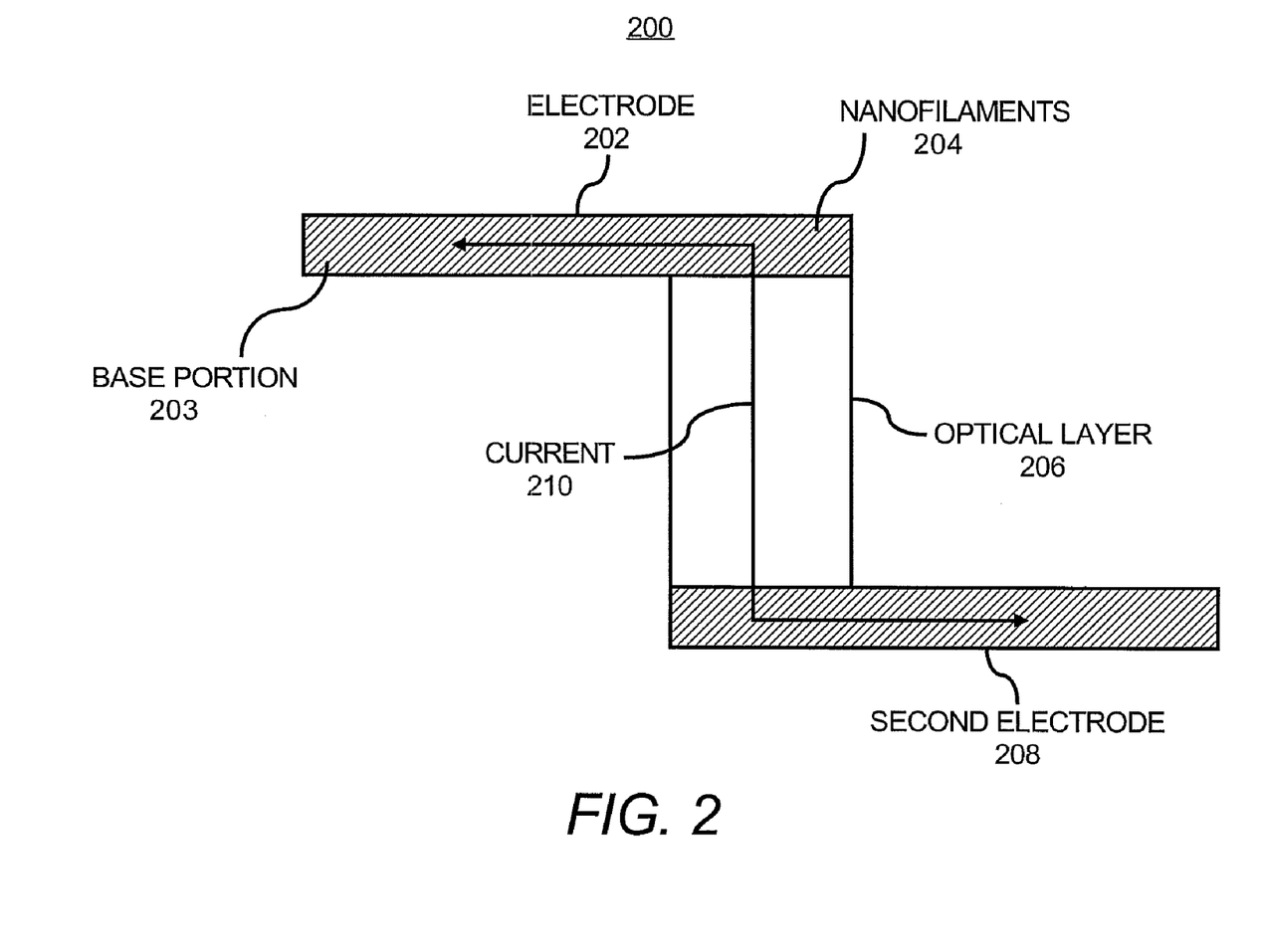
FIG. 2 illustrates a cross-sectional side view of an optical device, according to another embodiment.

With respect to FIG. 2, there is shown a cross-sectional side view of an optical device 200, according to another embodiment. It should be understood that the following description of the optical device 200 is but one manner of a variety of different manners in which such an optical device 200 may be configured. In addition, it should be understood that the optical device 200 may include additional elements and devices not shown in FIG. 2 and that some of the features described herein may be removed and/or modified without departing from a scope of the optical device 200.

The optical device 200 comprises an electrode 202, an optical layer 206, and a second electrode 208. The electrode 202 includes a base portion 203 and nanofilaments 204 in connection with the base portion 203. The electrode 202 may be substantially similar to the electrode 102 described above with respect to FIGS. 1A-1C. Thus, the electrode 202 is configured to conduct a current 210 through the optical layer 206 while reducing eddy currents. The base portion 203 of the electrode 202 is not in direct physical contact with the optical layer 106, like the base portion 103 of the electrode 102, shown in FIGS. 1A-1C. Instead, the nanofilaments 204 of the electrode 202 are in contact with the optical layer 206. Thus, the current 210 flows between the base portion 203 and the optical layer 206 via the nanofilaments 204. The current 210 is depicted as a double-headed arrow because the current 210 may flow in both directions between the electrode 202, the optical layer 206, and the second electrode 208.

The optical layer 206 may be substantially similar to the optical layer 106 described above with respect to FIGS. 1A-1C. As such, the second electrode 208 may be configured to conduct a current through the optical layer 206. The second electrode 208 may be a conventional ohmic contact or may comprise a base portion 203 and nanofilaments 204 similar to the electrode 202. Therefore, the second electrode 208 may also be configured to reduce eddy currents and may be substantially similar to the electrode 102 described above with respect to FIGS. 1A-1C.

Figure 3:
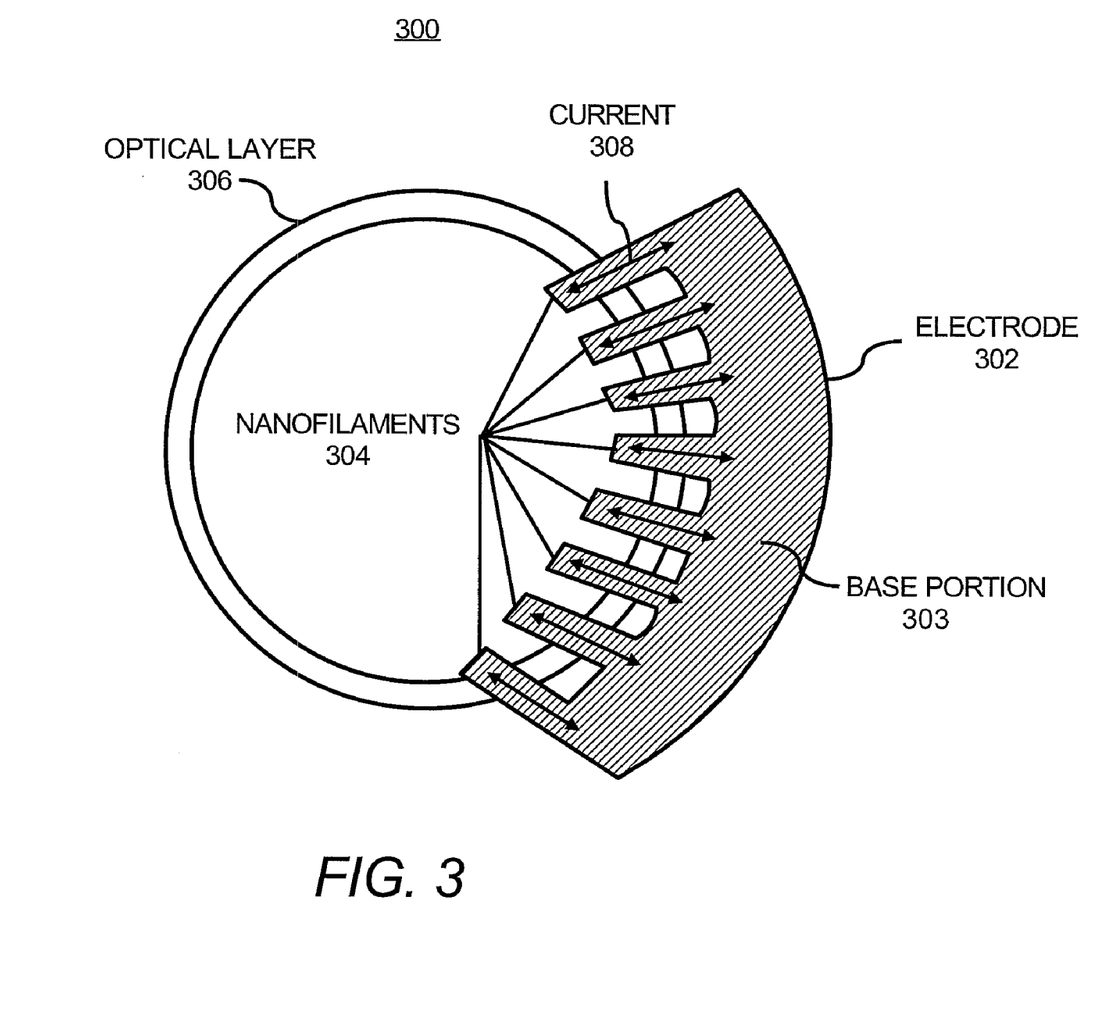
FIG. 3 illustrates a top view of an optical device, according to another embodiment.

With respect to FIG. 3, there is shown a cross-sectional side view of an optical device 300, according to another embodiment. It should be understood that the following description of the optical device 300 is but one manner of a variety of different manners in which such an optical device 300 may be configured. In addition, it should be understood that the optical device 300 may include additional elements and devices not shown in FIG. 3 and that some of the features described herein may be removed and/or modified without departing from a scope of the optical device 300.

The optical device 300 comprises an electrode 302 and an optical layer 306. The electrode 302 includes a base portion 303 and nanofilaments 304 in connection with the base portion 303. The optical device 300 is similar to the optical device 100, shown in FIGS. 1A-C, in that the electrode 302 is configured to conduct a current 308 between the base portion 303 of the electrode 302 and the optical layer 306 via the nanofilaments 304. However, the optical layer 306 shown in FIG. 3 is non-linear, whereas the optical layer 106, shown in FIGS. 1A-C, is substantially linear. For example, the optical layer 306 is circular. However, a person having ordinary skill in the art will appreciate that the optical layer 306 may have any reasonably suitable shape and configuration. In one example, the optical device 300 may comprise a ring resonator. Therefore, the optical layer 306 may be a closed loop waveguide and the optical device 300 may include additional components, such as an input/output waveguide coupled to the closed loop waveguide.

The electrode 302 has a curved or semi-circular shape, which substantially conforms to the circular optical layer 306. However, the electrode 302 may have any reasonably suitable shape or size. Similarly, although the electrode 302 is shown as having eight nanofilaments 304, a person having ordinary skill in the art will appreciate that the electrode 302 may have any number of nanofilaments 304 having any reasonably suitable period, as set forth above with respect to FIGS. 1A-2.

The electrodes 102, 202, 302 according to the embodiments described herein and shown in FIGS. 1-3 may be used in systems and methods to reduce eddy currents in an optical device 100, 200, 300 by associating an electrode 102, 202, 302 with an optical layer 106, 206, 306 of an optical device 100, 200, 300. When a current flow is induced, the current flows through the nanofilaments 104, 204, 304 between the optical layer 106, 206, 306 and the base portion 103, 203, 303 of the electrode 102, 202, 302. A person having ordinary skill in the art will appreciate that a current may flow in either direction between the nanofilaments 104, 204, 304 and the optical layer 106, 206, 306. Due to the configuration of the nanofilaments 104, 204, 304, eddy currents are reduced because current flow across the width and thickness of the nanofilaments 104, 204, 304 is inhibited, as described above. The reduction of eddy currents results in a more efficient flow of electrons and, thus, a faster optical device 100, 200, 300.

Figure 4:
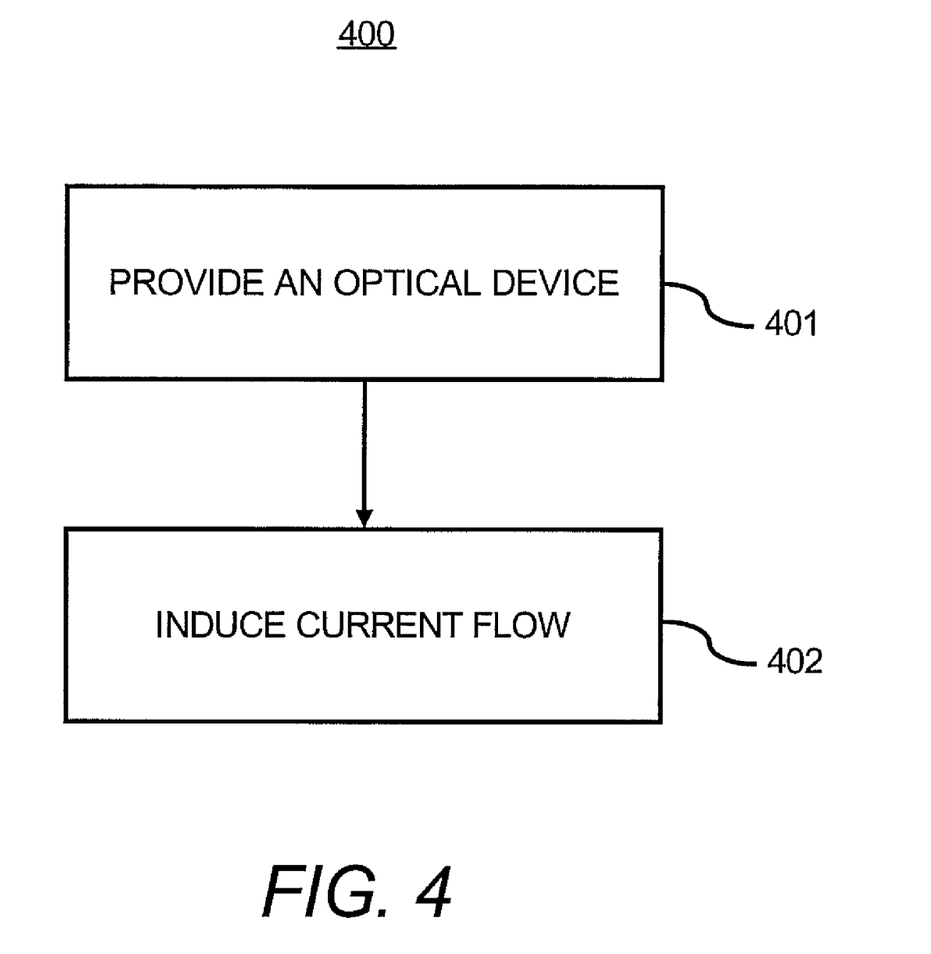
FIG. 4 illustrates a flow chart of a method of reducing eddy currents in an optical device, according to another embodiment.

Turning now to FIG. 4, there is shown a flow diagram of a method 400 for reducing eddy currents in an optical device, according to an embodiment. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400.

The method 400 may be initiated at step 401 where an optical device is provided. The optical device may include an electrode and an optical layer associated with the electrode. The electrode may include an electrically conductive base portion and nanofilaments in connection with the electrically conductive base portion and, thus, may be similar to the electrodes 102, 202, or 302 described above with respect to FIGS. 1-3, respectively.

At step 402, a current flow may be induced between the optical layer and the electrode. The current may flow between the optical layer and the base portion of the electrode via the nanofilaments. In this manner, eddy currents are reduced in the optical device because of the configuration of the nanofilaments.

What has been described and illustrated herein are examples of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims and their equivalents in which all terms are meant in their broadest reasonable sense unless otherwise indicated.

What is claimed is:

1. An optical device comprising:
   an electrode configured to reduce eddy currents, wherein the electrode comprises an electrically conductive base portion and a plurality of nanofilaments in connection with the electrically conductive base portion, wherein the base portion has a width and a length longer than the width, and lengths of the plurality of nanofilaments are substantially parallel to the length of the base portion; and an optical layer associated with the plurality of nanofilaments of the electrode, wherein the plurality of nanofilaments are operable to conduct an electric current between the optical layer and the base portion of the electrode.

2. The optical device of claim 1, wherein the optical layer comprises a substantially linear waveguide.

3. The optical device of claim 1, wherein the optical layer comprises an active region of a light emitting device.

4. The optical device of claim 1, wherein the optical layer comprises a circular or semi-circular waveguide.

5. The optical device of claim 1, wherein the electrode is arranged such that the plurality of nanofilaments are substantially parallel to a length of the optical layer.

6. The optical device of claim 1, wherein the electrode is arranged such that the plurality of nanofilaments are substantially perpendicular to the optical layer.

7. The optical device of claim 1, wherein each of the plurality of nanofilaments have a width of less than 100 nanometers.

8. The optical device of claim 1, wherein the plurality of nanofilaments are electrically conductive along a length of the nanofilaments and substantially non-electrically conductive across a width of the nanofilaments.

9. The optical device of claim 1, wherein the plurality of nanofilaments are arranged in a substantially uniform configuration.

10. The optical device of claim 1, wherein the plurality of nanofilaments are clustered into groups of nanofilaments.

11. The optical device of claim 1, further comprising:
a second electrode associated with the optical layer, wherein the electrode and the second electrode conduct a current through the optical layer.

12. An optical ring resonator comprising:
a closed loop waveguide; and
an electrode configured to reduce eddy currents, wherein the electrode includes an electrically conductive base portion in connection with a plurality of nanofilaments, wherein the plurality of nanofilaments are configured to conduct an electric current between the closed loop waveguide and the base portion of the electrode.

13. The optical ring resonator of claim 12, further comprising:
an input/output waveguide coupled to the closed loop waveguide.

14. The optical ring resonator of claim 12, wherein the electrode has a curved shape to substantially conform to the shape of the closed loop waveguide.

15. The optical ring resonator of claim 12, wherein the electrode is positioned such that only the nanofilaments are in contact with the closed loop waveguide.

16. The optical ring resonator of claim 12, wherein the nanofilaments have a width of less than 100 nanometers.

17. A method of reducing eddy currents in an optical device comprising:
providing the optical device, wherein the optical device includes an electrode and an optical layer associated with the electrode and wherein the electrode comprises an electrically conductive base portion and nanofilaments in connection with the electrically conductive base portion,
wherein,
wherein the base portion has a width and a length longer than the width, and lengths of the plurality of nanofilaments are substantially parallel to the length of the base portion; and
inducing a current flow between the optical layer and the electrode, wherein the nanofilaments facilitate the current flow between the optical layer and the base portion of the electrode.

18. The method of claim 17, wherein inducing the current flow comprises:
inducing the current flow along the length of the nanofilaments and inhibiting the current flow across the width of the nanofilaments.

19. The method of claim 17, wherein the nanofilaments are formed by etching away portions of the electrode.

20. The method of claim 17, wherein the nanofilaments have a width of less than 100 nanometers.

* * * * *